United States Patent
Toyama et al.

(10) Patent No.: US 7,884,371 B2
(45) Date of Patent: *Feb. 8, 2011

(54) LED BACKLIGHT DEVICE AND LCD DEVICE

(75) Inventors: Hiroshi Toyama, Hachioji (JP); Yukio Nakamura, Hachioji (JP)

(73) Assignee: Oki Data Corporation, Tokyo (JP)

( * ) Notice: Subject to any disclaimer, the term of this patent is extended or adjusted under 35 U.S.C. 154(b) by 238 days.

This patent is subject to a terminal disclaimer.

(21) Appl. No.: 12/038,831

(22) Filed: Feb. 28, 2008

(65) Prior Publication Data

US 2008/0218662 A1 Sep. 11, 2008

(30) Foreign Application Priority Data

Mar. 5, 2007 (JP) ............................... 2007-053824

(51) Int. Cl.
H01L 33/00 (2010.01)
(52) U.S. Cl. .............................. 257/72; 257/59; 257/79; 257/E51.018; 349/69
(58) Field of Classification Search .................. 257/52, 257/59, 72, 79–82, 98, 101, 103, E51.018; 362/612–613, 97.3; 349/69; 315/169.3
See application file for complete search history.

(56) References Cited

U.S. PATENT DOCUMENTS 5,813,753 A 9/1998 Vriens et al.
7,006,172 B2 * 2/2006 Kawana et al. ................ 349/71
7,481,563 B2 1/2009 David et al.
2003/0026096 A1 2/2003 Ellens et al.

(Continued)

FOREIGN PATENT DOCUMENTS

EP 1 385 215 A2 1/2004

(Continued)

OTHER PUBLICATIONS

Akihiko Murai et al., "Hexagonal pyramid shaped light-emitting diodes based on Zno and GaN direct wafer bonding", American Institute of Physics, vol. 89, No. 17, pp. 171116-1-171116-3, (2006).

(Continued)

Primary Examiner—Davienne Monbleau
Assistant Examiner—Hoa B Trinh
(74) Attorney, Agent, or Firm—Panitch Schwarze Belisario & Nadel LLP

(57) ABSTRACT

A backlight device includes a first substrate, and an LED thin-film layered structure (epitaxially grown inorganic material layers) fixed to a surface of the first substrate. An anode electrode and a cathode electrode are formed on the LED thin-film layered structure. An anode driver IC and a cathode driver IC are provided for driving the LED thin-film layered structure. A wiring structure electrically connects the anode driver IC and the anode electrode of the LED thin-film layered structure, and electrically connects the cathode driver IC and the cathode electrode of the LED thin-film layered structure. A second substrate has an optical transparency and is disposed to face the surface of the first substrate on which the LED thin-film layered structure is formed. A phosphor is formed on a surface of the second substrate facing the first substrate and is disposed on a position corresponding to the LED thin-film layered structure.

33 Claims, 12 Drawing Sheets

U.S. PATENT DOCUMENTS

| | | |
|---|---|---|
| 2004/0021629 A1 | 2/2004 | Sasuga et al. |
| 2006/0158581 A1 | 7/2006 | Komoto et al. |
| 2007/0080626 A1* | 4/2007 | Son et al. ............... 313/499 |
| 2008/0211993 A1 | 9/2008 | Toyama et al. |

FOREIGN PATENT DOCUMENTS

| | | | |
|---|---|---|---|
| EP | 1521235 | A2 | 4/2005 |
| JP | 9232198 | A | 9/1997 |
| JP | 11-232920 | A | 8/1999 |
| JP | 2000-133006 | A | 5/2000 |
| JP | 2003068109 | A | 3/2003 |
| JP | 2004119634 | A | 4/2004 |
| JP | 2005051117 | A | 2/2005 |
| JP | 2005079369 | A | 3/2005 |
| JP | 2005093649 | A | 4/2005 |
| JP | 2005150703 | A | 6/2005 |
| JP | 2006244779 | A | 9/2006 |
| JP | 2006261218 | A | 9/2006 |
| JP | 2006-308858 | A | 11/2006 |
| WO | 9748138 | A2 | 12/1997 |
| WO | WO 2006/076210 | A2 | 7/2006 |

OTHER PUBLICATIONS

Japanese Office Action dated Aug. 25, 2009 in Japanese Patent Application No. 2007-053824.

Po-Chun Liu et al., "Wafer bonding for high-brightness light-emitting diodes via indium tin oxide intermediate layers", Thin Solid Films, vol. 478, No. 1-2, pp. 280-285, (2005).

* cited by examiner

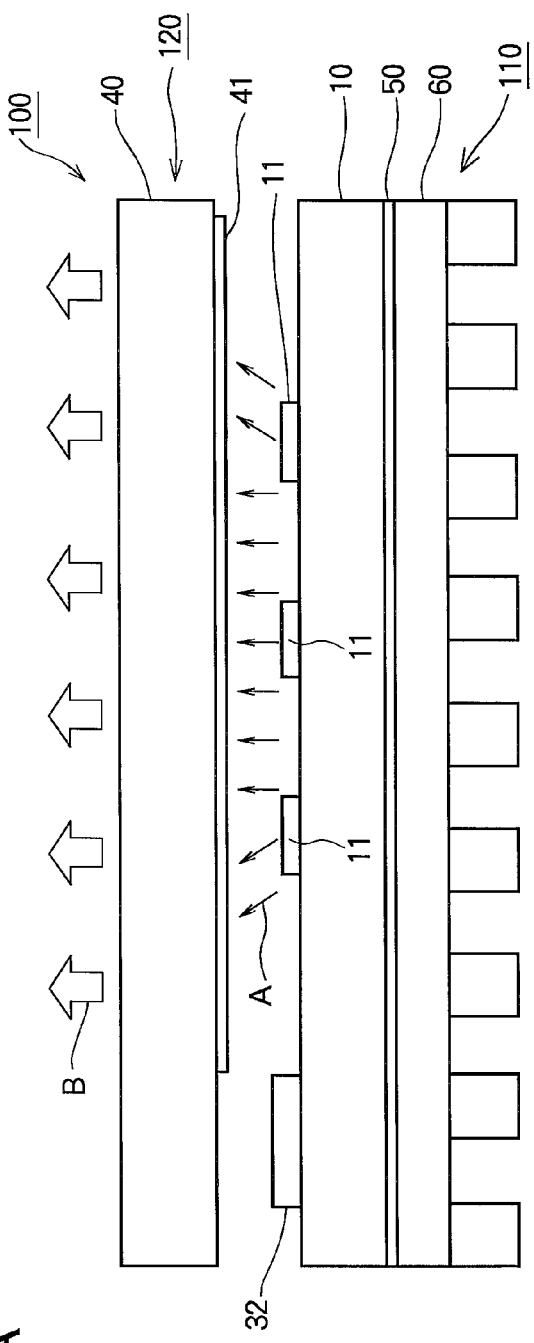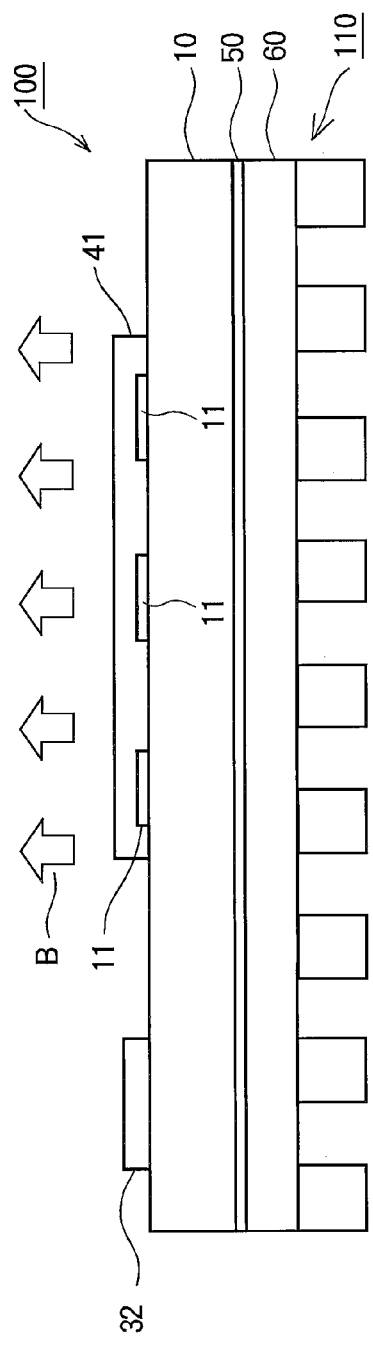

US 7,884,371 B2

LED BACKLIGHT DEVICE AND LCD DEVICE

BACKGROUND OF THE INVENTION

This invention relates to an LED backlight device and an LCD device using the LED backlight device.

In a general LCD (Liquid Crystal Display) device, a light is emitted by a light source, and is incident on an LCD panel. The LCD device is configured to change molecular alignments of liquid crystals (pixels) arranged on the LCD panel, so as to display an image using the light passing through the LCD panel.

The light source used in such an LCD device is called as a backlight, since the light source is disposed on the backside of the LCD panel (i.e., the side opposite to a display surface of the LCD panel). The conventional light source is composed of a cold cathode ray tube or a semiconductor light emitting element. The light source using the semiconductor light emitting element has been broadly used, since such a light source has a long lifetime and contributes to reduction of power consumption.

In this regard, there is known a surface-emitting light source that uses an LED (Light Emitting Diode) as the above described semiconductor light emitting element. Such a surface-emitting light source has a plate-like member called as a light guiding plate or a light diffusion plate for guiding the light emitted by the LED. The light emitted by the LED is incident on an end surface of the light guiding plate. The light guiding plate reflects and diffuses the incident light in the direction perpendicular to the surface of the light guiding plate, and emits the light from a surface thereof (see Patent Document No. 1).

Patent Document No. 1: Japanese Laid-Open Patent Publication No. 11-232920.

However, in the conventional backlight device, the light diffused in the interior of the light guiding plate tends to attenuate due to the reflection and diffusion, as a distance from the incident surface (i.e., the end surface of the light guiding plate) increases. Therefore, in order to obtain a high light intensity uniformly over the entire surface, the structure of the light guiding plate needs to be complicated, and the LED backlight device needs to be thick.

SUMMARY OF THE INVENTION

The present invention is intended to solve the above described problems, and an object of the present invention is to provide a thin LED backlight device capable of providing a high light intensity, and an LCD device using such an LED backlight.

The present invention provides a backlight device including a first substrate, an LED thin-film layered structure fixed to a surface of the first substrate, the LED thin-film layered structure being formed of epitaxially grown inorganic material layers as a P-N junction device, an anode electrode and a cathode electrode formed on the LED thin-film layered structure, an anode driver IC and a cathode driver IC for driving the LED thin-film layered structure, a wiring structure that electrically connects the anode driver IC and the anode electrode of the LED thin-film layered structure, and electrically connects the cathode driver IC and the cathode electrode of the LED thin-film layered structure, a second substrate having an optical transparency and disposed to face the surface of the first substrate on which the LED thin-film layered structure is formed, and a phosphor formed on a surface of the second substrate facing the first substrate and disposed on a position corresponding to the LED thin-film layered structure.

Since the first substrate on which the LED thin-film layered structure is formed and the second substrate (having an optical transparency) on which the phosphor is formed face each other, it becomes possible to obtain a thin LED backlight device providing a high light intensity.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

In the attached drawings:

FIGS. 15A and 15B show modifications of the LED backlight device according to the embodiments of the present invention.

DETAILED DESCRIPTION OF THE PREFERRED EMBODIMENT

Hereinafter, embodiments of the present invention will be described with reference to the attached drawings.

First Embodiment

Figure 1:
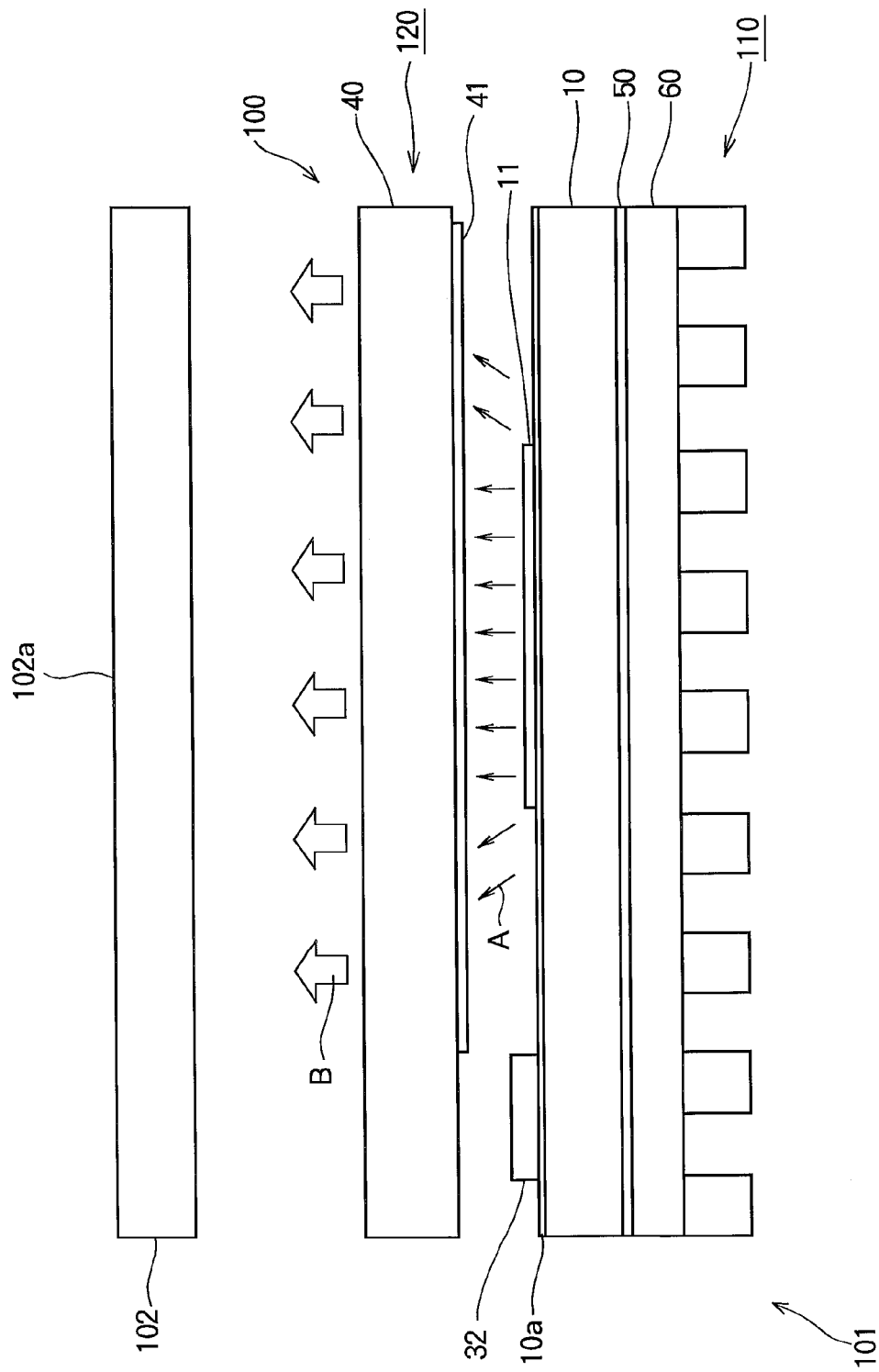
FIG. 1 is a side sectional view showing a main part of an LCD device including an LED backlight device according to the first embodiment of the present invention.
Figure 2:
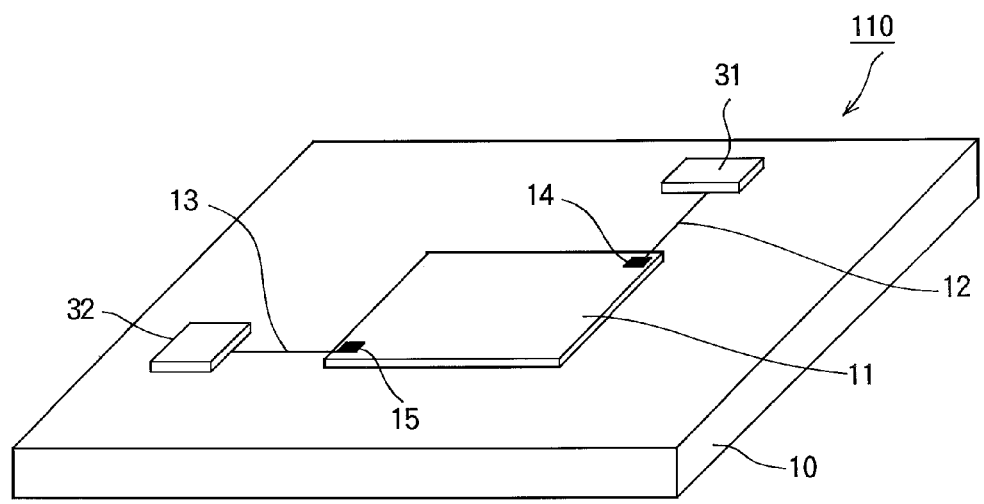
FIG. 2 is a perspective view showing an LED element portion according to the first embodiment of the present invention.
Figure 3:
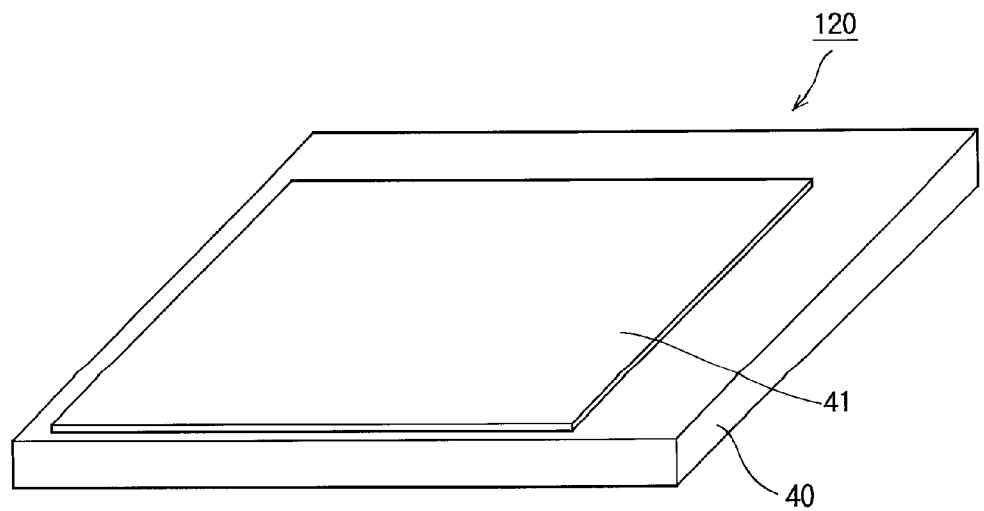
FIG. 3 is a perspective view showing a phosphor sheet portion according to the first embodiment of the present invention.
Figure 4:
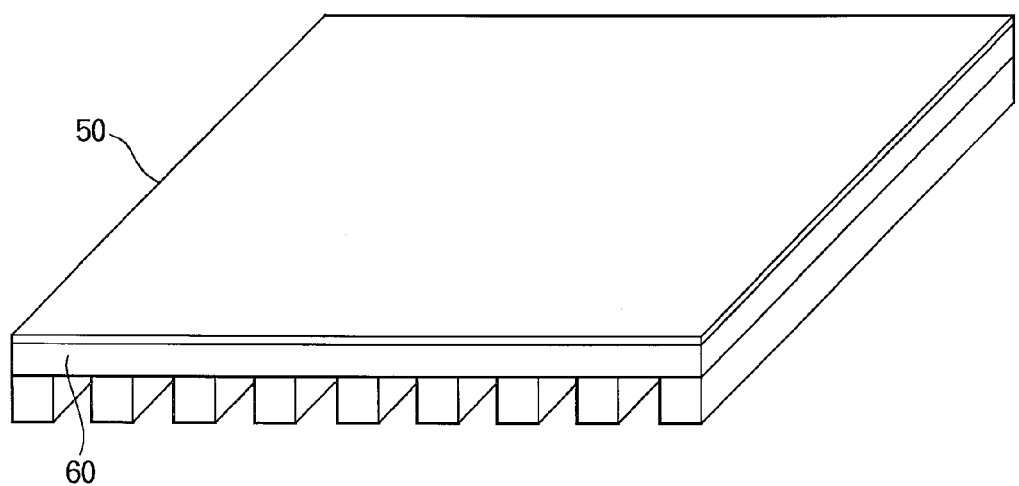
FIG. 4 is a perspective view showing a heat releasing plate according to the first embodiment of the present invention.

FIG. 1 is a side sectional view showing a main part of an LCD device including an LED backlight device according to the first embodiment of the present invention. FIG. 2 is a perspective view showing an LED element portion of the LED backlight device according to the first embodiment of the present invention. FIG. 3 is a perspective view showing a phosphor sheet portion of the LED backlight device according to the first embodiment of the present invention. FIG. 4 is a perspective view showing a heat releasing plate according to the first embodiment of the present invention.

In FIG. 1, an LED backlight device 100 according to the first embodiment is used as a light source in an LCD device 101, and is disposed on a backside of an LCD panel 102 (i.e., the side opposite to a display surface 102a of the LCD panel 102). The LCD panel 102 is of a transmission type. The LED backlight device 100 according to the first embodiment includes an LED element portion 110 and a phosphor sheet portion 120 provided to face the LED element portion 110.

In FIGS. 1 through 4, the LED backlight device 100 includes a substrate (i.e., a first substrate) 10 in the form of a flat plate. The LED backlight device 100 further includes an LED 11 (i.e., an LED thin-film layered structure) fixed to a surface of the substrate 10. The LED 11 emits near-ultraviolet rays or ultraviolet rays. Further, an anode driver IC 31 and a cathode driver IC 32 for driving the LED 11 are disposed on the surface of the substrate 10. The anode driver IC 31 is connected to an end of an anode wiring 12 (formed on the surface of the substrate 10) connected to an anode electrode 14 of the LED 11. The cathode driver IC 32 is connected to an end of a cathode wiring 13 (formed on the surface of the substrate 10) connected to a cathode electrode 15 of the LED 11. The anode wiring 12 and the cathode wiring 13 constitute a wiring structure for electrically connecting the anode driver IC 31 to the LED 11, and for electrically connecting the cathode driver IC 32 to the LED 11.

The substrate 10 is composed of, for example, a wiring board formed of metal, silicon or ceramic having an excellent thermal conductivity, a heat resistant FR-4 substrate (a substrate with a glass base material and epoxy resin laminate) that is designed in consideration of thermal conductivity, or the like. The surface of the substrate 10 is composed of a surface layer 10a formed of an organic insulation film (such as polyimide film) or an inorganic insulation film, and is planarized so that the surface accuracy is several tens of nanometers. The LED 11 is peeled off from another substrate as described later, and is fixed to the substrate 10 by means of intermolecular force such as hydrogen bonding, so that the LED 11 is integrated with the substrate 10.

A heat releasing plate 60 is fixed to the backside of the substrate 10 (i.e., the surface opposite to the surface to which the LED 11 is fixed) by means of a thermally-conductive adhesive agent 50. The heat releasing plate 60 is made of a metal or the like having an excellent thermal conductivity.

The above described LED 11 is a thin-film LED that emits near-ultraviolet rays or ultraviolet rays, and is composed of a thin-film layered structure having a heterostructure or a double-heterostructure formed by epitaxially growing inorganic material such as gallium nitride, gallium indium nitride, aluminum gallium nitride, aluminum nitride or the like. The LED 11 is not limited to the above described material, but can be composed of any kind of material that emits near-ultraviolet rays or ultraviolet rays, more preferably, the light having the wavelength ranging from 300 to 450 nm.

The anode electrode 14 and the cathode electrode 15 are metal electrodes composed of gold, aluminum, or layered metal electrodes composed of gold or aluminum layered with nickel, titan or the like. The anode electrode 14 and the cathode electrode 15 are respectively connected to an anode and a cathode of the LED 11.

The anode wiring 12 and the cathode wiring 13 are metal wirings composed of gold, aluminum, or layered metal wirings composed of gold or aluminum layered with nickel, titan or the like. The anode wiring 12 and the cathode wiring 13 are respectively connected to the anode electrode 14 and the cathode electrode 15 of the LED 11. An end of the anode wiring 12 is connected the anode driver IC 31, and an end of the cathode wiring 13 is connected the cathode driver IC 32, so that the anode electrode 14 and the cathode electrode 15 of the LED 11 are connected to the anode driver IC 31 and the cathode driver IC 32 via the anode wiring 12 and the cathode wiring 13.

The phosphor sheet portion 120 includes a plate-like transparent substrate 40 (i.e., a second substrate) and a phosphor 41 formed on the transparent substrate 40. The transparent substrate 40 is composed of glass or plastic having an optical transparency. The phosphor 41 emits white light when exposed to near-ultraviolet or ultraviolet rays. The phosphor 41 is coated on the surface of the transparent substrate 40.

The phosphor 41 can be formed by mixing a phosphor that emits red light, a phosphor that emits green light and a phosphor that emits blue light. To be more specific, the phosphor that emits red light is, for example, $Y_2O_3$:Eu or (Y, Gd)$BO_3$:Eu. The phosphor that emits green light is, for example, $LaPO_4$:Ce, Tb or $Zn_2SiO$:Mn. The phosphor that emits blue light is, for example, (Sr, Ca, Ba, Mg)$_5$(PO$_4$)$_3$Cl:Eu or $BaMgAl_{10}O_{17}$:Eu.

The phosphor that emits red light is not limited the above described material, but can be composed of any kind of material that emits light having the wavelength ranging from 620 nm to 710 nm when exposed to near-ultraviolet or ultraviolet rays having the wavelength ranging from 300 nm to 450 nm. The phosphor that emits green light can be composed of any kind of material that emits light having the wavelength ranging from 500 nm to 580 nm when exposed to near-ultraviolet or ultraviolet rays having the wavelength ranging from 300 nm to 450 nm. The phosphor that emits blue light can be composed of any kind of material that emits light having the wavelength ranging from 450 nm to 500 nm when exposed to near-ultraviolet or ultraviolet rays having the wavelength ranging from 300 nm to 450 nm.

As shown in FIG. 1, the LED backlight device 100 can be obtained by disposing the LED element portion 110 and the phosphor sheet portion 120 so that the LED element portion 110 and the phosphor sheet portion 120 face each other. In this case, the surface of the substrate 10 to which the LED 11 is fixed and the surface of the transparent substrate 40 to which the phosphor 41 is fixed face each other. The substrate 10 and the transparent substrate 40 are positioned (and fixed) relative to each other so that the LED 11 on the substrate 10 and the phosphor 41 on the transparent substrate 40 face each other.

With such an arrangement, when the LED 11 emits near-ultraviolet rays or ultraviolet rays having the wavelength ranging from 300 to 450 nm as shown by arrows A in FIG. 1, the phosphor 41 (facing the LED 11) emits white light as shown by arrows B in FIG. 1.

The anode driver IC 31 has a function to supply electric current to the LED 11 according to a lighting signal. In the anode driver IC 31, for example, a shift register circuit, a latch circuit, a constant current circuit, an amplifier circuit and the like are integrated. The anode wiring 12 is connected to the anode electrode 14 of the LED and is also connected to a driving element of the anode driver IC 31. Although the anode driver IC 31 is provided on the substrate 10 in the example shown in FIG. 2, the anode driver IC 31 is not necessarily provided on the substrate 10, but can be provided on other print circuit board (not shown) or the like.

The cathode driver IC 32 has a function to allow the electric current to flow therein. In the cathode driver IC 32, switching circuits such as transistor or the like are integrated. The cathode wiring 13 is connected to the cathode electrode 15 of the LED 11 and is also connected to the cathode driver IC 32. The cathode driver IC 32 is not necessarily provided on the substrate 10, but can be provided on other print circuit board (not shown) or the like.

Next, the process for forming the LED 11 on the substrate 10 will be described.

Figure 5:
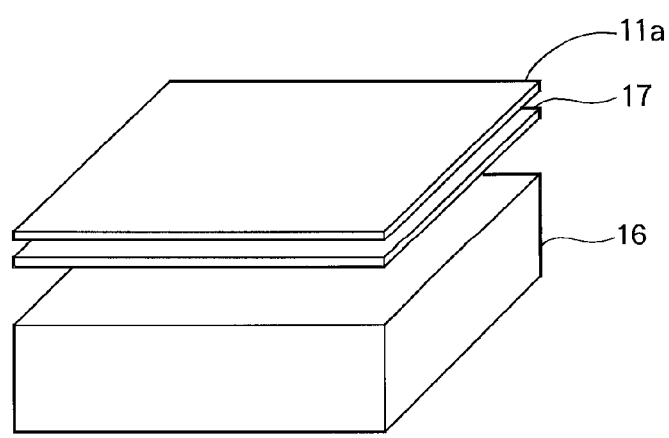
FIG. 5 is a schematic view showing a process for peeling an LED thin-film layered structure according to the first embodiment of the present invention.
Figure 6:
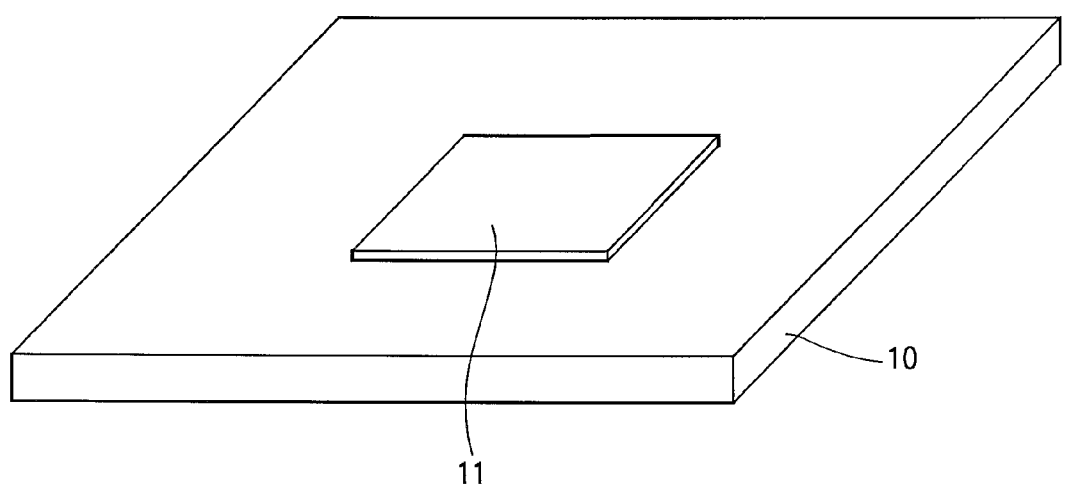
FIG. 6 is a schematic view showing a process for integrating the LED thin-film layered structure to a substrate according to the first embodiment of the present invention.

FIG. 5 shows a process for peeling a thin-film layered structure (the LED 11) according to the first embodiment of the present invention. FIG. 6 shows a process for fixing the thin-film layered structure (the LED 11) to the substrate according to the first embodiment of the present invention.

In the first embodiment, the LED 11 is made of a thin-film layered structure in the form of a rectangular flat plate, and is integrally fixed to the substrate 10 as described later. Further, the LED 11 is a thin-film layered structure having heterostructure or double-heterostructure composed of a plurality of layers such as gallium nitride or indium gallium nitride, aluminum gallium nitride or aluminum nitride or the like.

A sacrificial layer 17 is provided between a base material 16 and the LED 11 for peeling (i.e., separating) the LED 11 from the base material 16. The sacrificial layer 17 is composed of material such as, for example, aluminum arsenide that can easily be etched by an etching solution described later.

The base material 16 is composed of, for example, gallium arsenide, gallium nitride, sapphire or the like. A thin-film layered structure 11a of inorganic material layers (that becomes the LED 11) is epitaxially grown on the base material 16 using a vapor-phase growth method such as an MOCVD method.

Next, a process for peeling the LED 11 (i.e., an epitaxially grown thin-film layered structure 11a) from the base material 16 will be described.

If the LED 11 is designed to have, for example, a square shape having each side of 20 mm in length, the thin-film layered structure 11a is formed to have a width and a length greater than or equal to 20 mm. In this case, the thin-film layered structure 11a is formed in a rectangular shape on the base material 16 using an etching solution such as a solution containing phosphoric acid, hydrogen peroxide and water ($H_3PO_4$:$H_2O_2$:$H_2O$) or the like, by means of a photolithographic etching technique broadly used in a semiconductor manufacturing process.

Next, the base material 16 on which the thin-film layered structure 11a is formed is immersed in an etching solution such as hydrogen fluoride solution, hydrochloric solution or the like. With this, the sacrificial surface 17 is etched, and the thin-film layered structure 11a (i.e., the LED 11) is peeled off from the base material 16.

Then, the LED 11 (having been peeled off from the base material 16) is pressed against the planarized surface of the substrate 10, and the substrate 10 and the LED 11 are fixed to each other by means of intermolecular force and integrated with each other.

The surface of the substrate 10 is composed of the surface layer 10a formed of an organic insulation film such as polyimide film or an inorganic insulation film such as silicon oxide firm, and preferably is a flat surface whose surface accuracy is less than or equal to several tens of nanometers having no concaves or convexes. Since the surface of the substrate 10 is such a flat surface having no concave or convex, the bonding between the LED 11 and the substrate 10 by means of intermolecular force (such as hydrogen bonding or the like) can be facilitated. With this, as shown in FIG. 6, the square shaped LED 11 is fixed to and integrated with the substrate 10.

Subsequently, connecting portions of the anode electrode 14 and the cathode electrode 15 are formed on the LED 11 (having been fixed to the substrate 10) using, for example, a photolithographic etching method by means of an etching solution containing phosphoric acid and hydrogen peroxide and water ($H_3PO_4$:$H_2O_2$:$H_2O$). Further, the anode electrode 14 and the cathode electrode 15, and the anode wiring 12 (connected to the anode electrode 14) and the cathode wiring 13 (connected to the cathode electrode 15) are formed using a deposition, a photolithographic etching method or a lift-off method. Furthermore, the anode driver IC 31 and the cathode driver IC 32 are mounted to the substrate 10, and the anode wiring 12 and the cathode wiring 13 are respectively connected to the anode driver IC 31 and the cathode driver IC 32.

Next, the operation of the above configured LED backlight device 100 will be described.

First, when a lighting signal sent from a superior device (such as a not shown personal computer) is inputted to the anode driver IC 31, an amplifier circuit of the anode driver IC 31 applies a constant current to the anode electrode 14 of the LED 11 via the anode wiring 12. When the lighting signal is inputted to the cathode driver IC 32, the cathode driver IC 32 allows the current to flow therein from the cathode electrode 15 of the LED 11 via the cathode wiring 13, so that the LED 11 emits the light.

When the LED 11 emits near-ultraviolet rays or ultraviolet rays having the wavelength ranging from 300 to 450 nm as shown by the arrows A in FIG. 1, the phosphor 41 (facing the LED 11) is excited by the near-ultraviolet rays or ultraviolet rays, and the phosphor 41 emits white light as shown by the arrows B in FIG. 1. The LCD panel 102 provided in opposition to the LED backlight device 10 is illuminated by the light (emitted by the phosphor 41) from the backside of the LED panel 102.

In this case, the heat generated by the emission of light of the LED 11 is diffused through the surface of the substrate 10 opposite to the LED 11 via the thermally-conductive adhesive agent 50 and the heat releasing plate 60. Therefore, the temperatures of the LED element portion 110 and the phosphor sheet portion 120 do not substantially increase.

In this regard, in order to prevent the oxidization or deterioration of the phosphor 41, it is possible to establish an inert gas atmosphere or to substantially form a vacuum in a space between the LED element portion 110 and the phosphor sheet portion 120.

As described above, in the first embodiment, the LED 11, the anode wiring 12 and the cathode wiring 13 are formed using the semiconductor process, and the LED 11 are connected to the anode wirings 12 and the cathode wirings 13 using the semiconductor process. Therefore, it becomes possible to form a thinner LED element portion 110. Accordingly, it becomes possible to accomplish a thinner LED backlight device 100.

Further, the LED element is known as an element having a high luminance and consuming less electric power, and has a record of performance. Using such a LED element as the light source, it becomes possible to obtain a luminance that can not be accomplished by the conventional light emitting device such as organic EL (Electric Luminescence) element.

Second Embodiment

Next, the second embodiment of the present invention will be described. Components of the second embodiment that are the same as those of the first embodiment are assigned the same reference numerals, and the description thereof are omitted. Further, the description of the operations and advantages that are same as those of the first embodiment are omitted.

Figure 7:
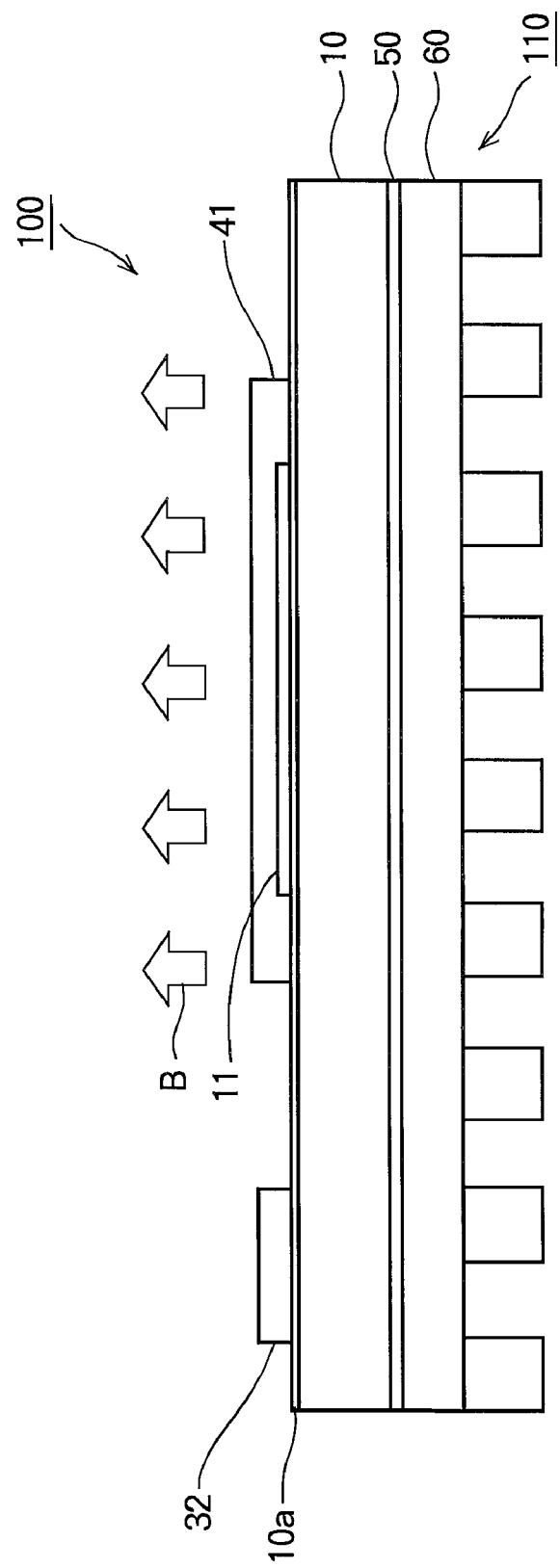
FIG. 7 is a side sectional view showing an LED backlight device according to second embodiment of the present invention.

FIG. 7 is a side sectional view showing the LED backlight device according to the second embodiment of the present invention.

In the second embodiment, the LED backlight device 100 has no phosphor sheet portion 120, but the LED element portion 110 is provided with the phosphor 41. To be more specific, the phosphor 41 is provided to entirely cover the LED 11 fixed to the surface of the substrate 10.

The phosphor 41 is formed by mixing a phosphor material into the silicone-based resin (generally used as a sealant) having an excellent thermal conductivity, and coating the resultant material on the LED 11 using a screen printing method, an inkjet method or the like.

The phosphor incorporated in the silicone-based resin emits white light when exposed to near-ultraviolet rays or ultraviolet rays, which is obtained by mixing a phosphor that emits red light, a phosphor that emits green light and a phosphor that emits blue light. As was described in the first embodiment, the phosphor that emits red light is, for example, $Y_2O_3$:Eu or (Y, Gd) $BO_3$:Eu. The phosphor that emits green light is, for example, $LaPO_4$:Ce, Tb or $Zn_2SiO$:Mn. The phosphor that emits blue light is, for example, (Sr, Ca, Ba, Mg)$_5$(PO$_4$)$_3$Cl:Eu or $BaMgAl_{10}O_{17}$:Eu.

The phosphor that emits red light is not limited the above described material, but can be composed of any kind of material that emits light having the wavelength ranging from 620 nm to 710 nm when exposed to near-ultraviolet or ultraviolet rays having the wavelength ranging from 300 nm to 450 nm. The phosphor that emits green light can be composed of any kind of material that emits light having the wavelength ranging from 500 nm to 580 nm when exposed to near-ultraviolet or ultraviolet rays having the wavelength ranging from 300 nm to 450 nm. The phosphor that emits blue light can be composed of any kind of material that emits light having the wavelength ranging from 450 nm to 500 nm when exposed to near-ultraviolet or ultraviolet rays having the wavelength ranging from 300 nm to 450 nm.

As was described in the first embodiment, the surface of the substrate 10 is composed of the surface layer 10a formed of an organic insulation film such as polyimide film or an inorganic insulation film such as silicon oxide firm, and preferably is a flat surface whose surface accuracy is less than or equal to several tens of nanometers having no concaves or convexes.

Other components of the LED backlight device 100 of the second embodiment are the same as those of the first embodiment, and description thereof are omitted.

Next, the operation of the above configured LED backlight device 100 will be described.

First, when a lighting signal sent from a superior device (such as a not shown personal computer) is inputted to the anode driver IC 31, the amplifier circuit of the anode driver IC 31 applies a constant current to the anode electrode 14 of the LED 11 via the anode wiring 12. When the lighting signal is inputted to the cathode driver IC 32, the cathode driver IC 32 allows the current to flow therein from the anode electrode 15 of the LED 11 via the cathode wiring 13, and the LED 11 emits the light.

When the LED 11 emits near-ultraviolet rays or ultraviolet rays having the wavelength ranging from 300 to 450 nm according to the lighting signal, the phosphor 41 (covering the LED 11) is excited by the near-ultraviolet rays or ultraviolet rays, and the phosphor 41 emits white light as shown by the arrows B in FIG. 7.

In this case, the heat generated by the emission of light of the LED 11 is diffused through the surface of the substrate 10 opposite to the LED 11 via the thermally-conductive adhesive agent 50 and the heat releasing plate 60. Therefore, the temperature of the LED element portion 110 does not substantially increase.

As described above, in the second embodiment, the phosphor 41 is provided to entirely cover the LED 11 fixed to the surface of the substrate 10, and therefore the phosphor sheet portion 120 (FIG. 1) can be eliminated. Accordingly, the LED backlight device 100 can be thinner than that of the first embodiment.

Third Embodiment

Next, the third embodiment of the present invention will be described. Components of the third embodiment that are the same as those of the first or second embodiment are assigned the same reference numerals, and the description thereof are omitted. Further, the description of the operations and advantages that are same as those of the first or second embodiment are omitted.

Figure 8:
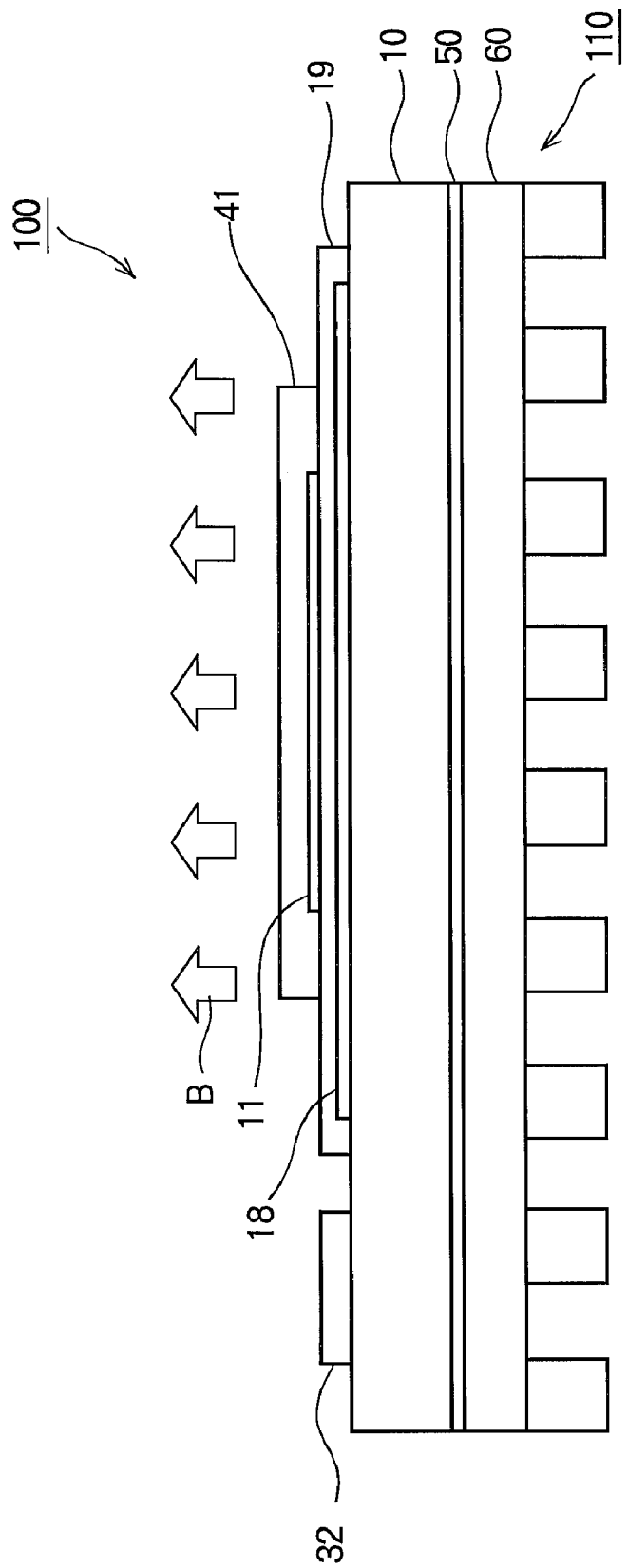
FIG. 8 is a side sectional view showing an LED backlight device according to the third embodiment of the present invention.
Figure 9:
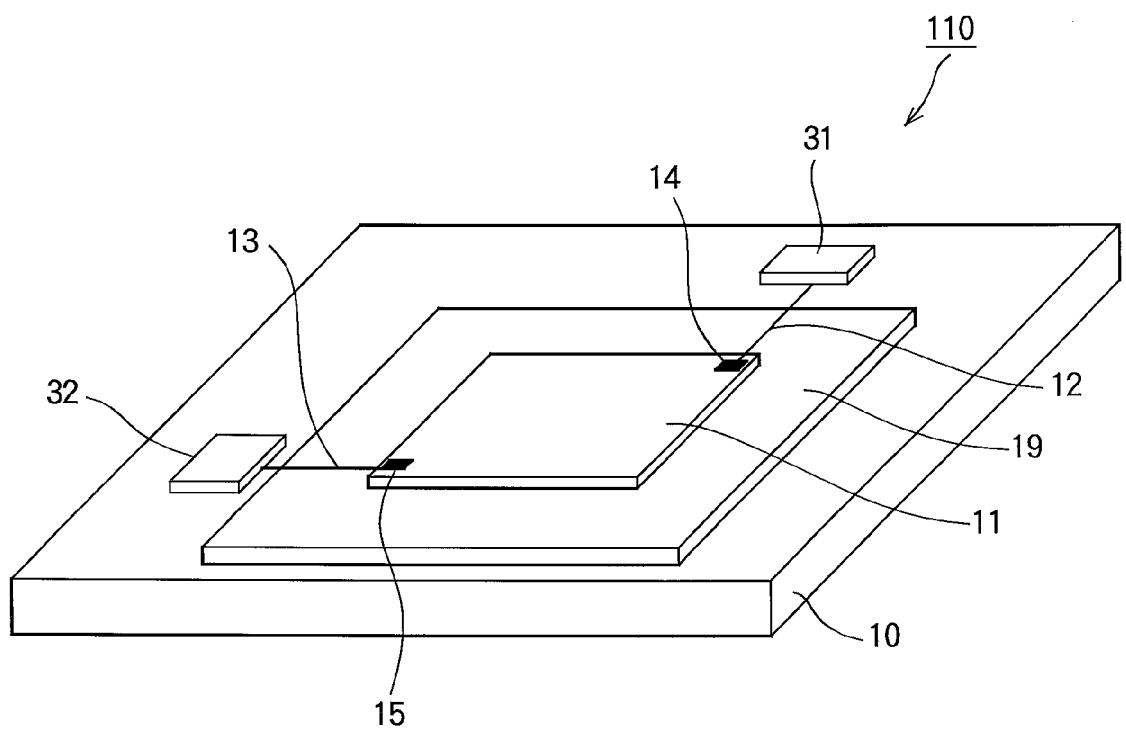
FIG. 9 is a perspective view showing the LED backlight device according to the third embodiment of the present invention.

FIG. 8 is a side sectional view showing the LED backlight device according to the third embodiment of the present invention. FIG. 9 is a perspective view showing the LED element portion according to the third embodiment of the present invention.

In the third embodiment, the LED element portion 110 has a reflection film 18 formed on the surface of the substrate 10, and the reflection film 18 reflects near-ultraviolet rays or ultraviolet rays emitted by the LED 11. A protection film 19 is formed to cover the reflection film 18 formed on the surface of the substrate 10, and the LED 11 is fixed to the surface of the protection film 19. Further, the phosphor 41 is provided to entirely cover the LED 11.

The reflection film 18 is provided for reflecting near-ultraviolet rays and ultraviolet rays emitted by the LED 11 toward the surface of the substrate 10, and reflecting near-ultraviolet rays and ultraviolet rays reflected by the phosphor 41 or reflected at a boundary surface (on which the phosphor 41 is formed). The reflection film 18 is formed by forming a metal film composed of gold or aluminum, or a layered metal film composed of gold or aluminum layered with nickel, titan or the like on the surface of the substrate 10, and patterning the metal film.

The protection film 19 is composed of an organic insulation film. (such as a polyimide film or the like) or an inorganic insulation film (such as a silicon oxide film or the like). The protection film 19 has a flat surface whose surface accuracy is less than or equal to several tens of nanometers having no concaves or convexes. Since the surface of the protection film 19 is such a flat surface having no concave or convex, the bonding between the LED 11 and the protection film 19 by means of intermolecular force (such as hydrogen bonding or the like) can be facilitated.

The LED 11 (having been peeled off from the base material 16 as was described in the first embodiment) is pressed against the planarized surface of the protection film 19, and the protection film 19 and the LED 11 are fixed to each other by means of intermolecular force and integrated with each other.

Subsequently, connecting portions of the anode electrode 14 and the cathode electrode 15 are formed on the LED 11 (having been fixed to the substrate 10) using, for example, a photolithographic etching method by means of an etching solution containing phosphoric acid and hydrogen peroxide and water ($H_3PO_4$:$H_2O_2$:$H_2O$). Further, the anode electrode 14 and the cathode electrode 15 of the LED 11, and the anode wiring 12 (connected to the anode electrode 14) and the cathode wiring 13 (connected to the cathode electrode 15) are formed using a deposition, a photolithographic etching method or a lift-off method.

Then, a silicone-based resin having an excellent thermal conductivity (generally used as a sealant) in which the phosphor is mixed and agitated is coated on the LED 11 using a screen printing method, an inkjet method or the like, so that the phosphor 41 is formed. In this regard, the phosphor incorporated in the silicone-based resin is a phosphor that emits white light when exposed to near-ultraviolet rays or ultraviolet rays, as was described in the second embodiment.

Further, the anode driver IC 31 and the cathode driver IC 32 are mounted to the substrate 10, and the anode wiring 12 and the cathode wiring 13 are respectively connected to the anode driver IC 31 and the cathode driver IC 32.

Other components of the LED backlight device 100 are the same as those of the second embodiment, and therefore description thereof are omitted.

Next, the operation of the above configured LED backlight device 100 of the third embodiment will be described.

First, when a lighting signal sent from a superior device (such as a not shown personal computer) is inputted to the anode driver IC 31, the amplifier circuit of the anode driver IC 31 applies a constant current to the anode electrode 14 of the LED 11 via the anode wiring 12. When the lighting signal is inputted to the cathode driver IC 32, the cathode driver IC 32 allows the current to flow therein from the cathode electrode 15 of the LED 11 via the cathode wiring 13, so that the LED 11 emits the light.

When the LED 11 emits near-ultraviolet rays or ultraviolet rays having the wavelength ranging from 300 to 450 nm, the phosphor 41 (facing the LED 11) is excited by the near-ultraviolet rays or ultraviolet rays, and the phosphor 41 emits white light as shown by the arrows B in FIG. 8. Further, the near-ultraviolet rays or ultraviolet rays emitted by the LED 11 toward the surface of the substrate 10, and the near-ultraviolet rays or ultraviolet rays reflected by the phosphor 41 or reflected at the boundary surface (on which the phosphor 41 is formed) are reflected by the reflection film 18, and are incident on the phosphor 41. Therefore, the phosphor 41 is also exited by the near-ultraviolet rays or ultraviolet rays reflected by the reflection film 18, and emits white light.

In this case, the heat generated by the emission of light of the LED 11 is diffused through the surface of the substrate 10 opposite to the LED 11 via the thermally-conductive adhesive agent 50 and the heat releasing plate 60. Therefore, the temperature of the LED element portion 110 does not substantially increase.

As described above, in the third embodiment, the LED 11 is provided above the reflection film 18 formed on the surface of the substrate 10, and the phosphor 41 is provided to entirely cover the LED 11, so that it becomes possible to provide a thinner LED backlight device 100 providing a high light intensity.

Fourth Embodiment

Next, the fourth embodiment of the present invention will be described. Components of the fourth embodiment that are the same as those of the first, second or third embodiment are assigned the same reference numerals, and the description thereof are omitted. Further, the description of the operations and advantages that are same as those of the first, second or third embodiment are omitted.

Figure 10:
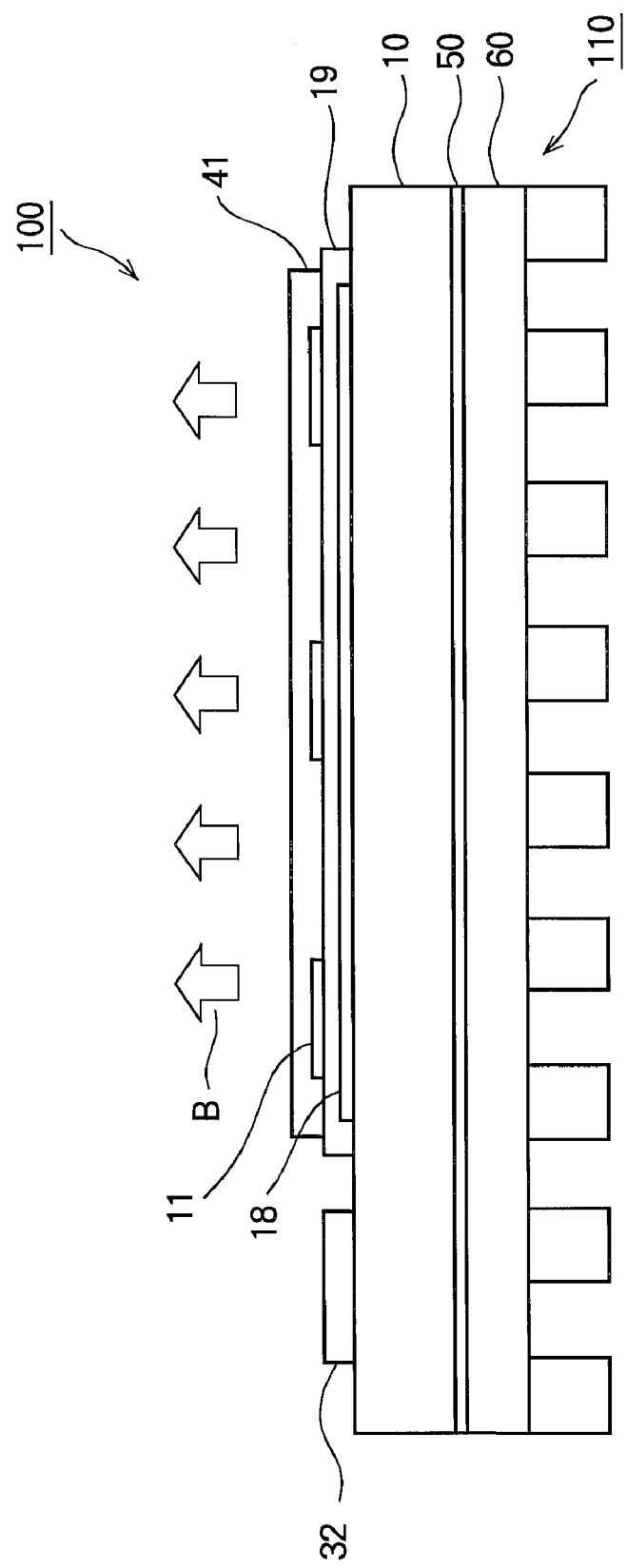
FIG. 10 is a side sectional view showing an LED backlight device according to the fourth embodiment of the present invention.
Figure 11:
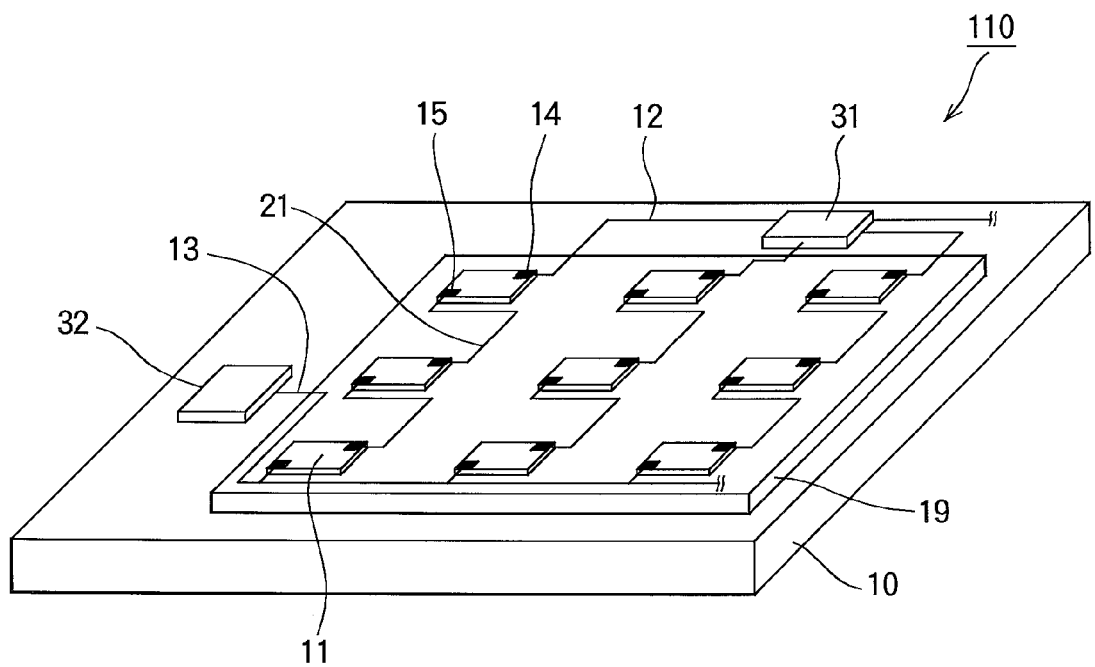
FIG. 11 is a perspective view showing the LED backlight device according to the fourth embodiment of the present invention.

FIG. 10 is a side sectional view showing the LED backlight device according to the fourth embodiment of the present invention. FIG. 11 is a perspective view showing the LED element portion according to the fourth embodiment of the present invention.

In the fourth embodiment, the LED element portion 110 has a reflection film 18 formed on the substrate 10, and the reflection film 18 reflects near-ultraviolet rays or ultraviolet rays emitted by a plurality of LEDs 11. A protection film 19 is formed to cover the reflection film 18 formed on the surface of the substrate 10, and a plurality of LEDs 11 are fixed to the surface of the protection film 19. Further, the phosphor 41 is provided to entirely cover the LEDs 11.

In this case, a plurality of LEDs 11 constitute an array arranged on the surface of the protection film 19 as shown in FIG. 11. In FIG. 11, the phosphor 41 is omitted for convenience of description.

Although the number of the LEDs 11 can be arbitrarily determined, the number of LEDs 11 is described to be 9 for convenience of illustration. Further, although the arranging manner of the LEDs 11 can be arbitrarily determined, the LEDs 11 are described to be arranged in a grid. To be more specific, in the example shown in FIG. 11, the LED array on the substrate 10 includes LEDs 11 arranged at equal intervals in a square grid and in a matrix with 3 rows and 3 columns.

The anode driver IC 31 is connected to an end of the anode wiring 12 connected to the anode electrode 14 of the LED 11 (i.e., the endmost LED 11) closest to the anode driver IC 31 of each column of the LEDs 11. The cathode driver IC 32 is connected to an end of the cathode wiring 13 connected to the cathode electrode 15 of the LED 11 (i.e., the endmost LED 11) farthest from the anode driver IC 31 of each column of the LEDs 11. Further, in each column, the anode electrodes 14 and the cathode electrodes 15 of the adjacent LEDs 11 are connected to each other by interconnection wirings 21. In other words, the LEDs 11 of each column are connected in series via the interconnection wirings 21. Further, the anode electrode 14 and the cathode electrode 15 of the endmost LEDs 11 of each column are respectively connected to the anode driver IC 31 and the cathode driver IC 32 via the anode wiring 12 and the cathode wiring 13.

Although the anode driver IC 31 is provided on the substrate 10 in the example shown in FIG. 11, the anode driver IC 31 is not necessarily provided on the substrate 10, but can be provided on other print circuit board (not shown) or the like.

Other components of the LED backlight device 100 of the fourth embodiment are the same as those of the third embodiment, and description thereof are omitted.

Next, the process for forming the LEDs 11 on the protection film 19 will be described.

Figure 12:
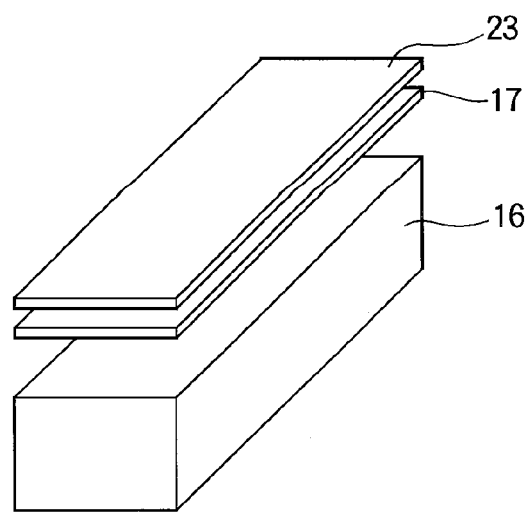
FIG. 12 is a schematic view showing a process for peeling an LED thin-film layered structure according to the fourth embodiment of the present invention.
Figure 13:
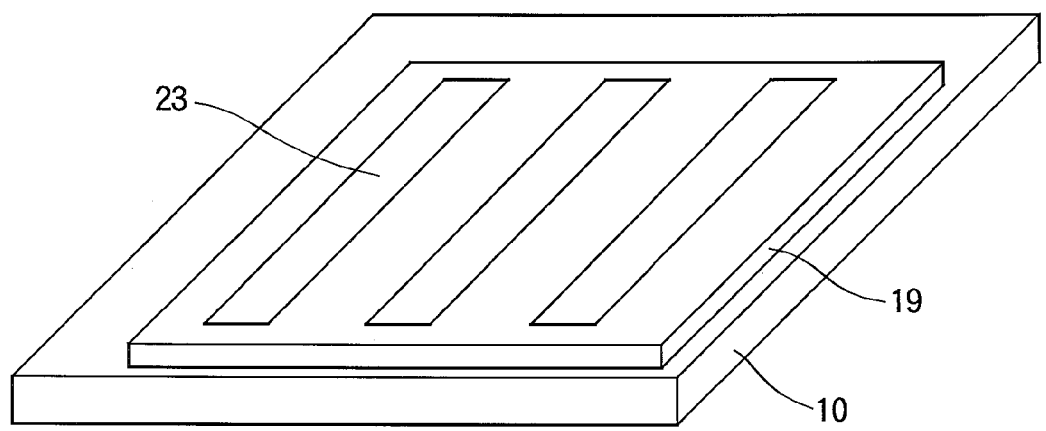
FIG. 13 is a schematic view showing a process for integrating the LED thin-film layered structure to a substrate according to the fourth embodiment of the present invention.
Figure 14:
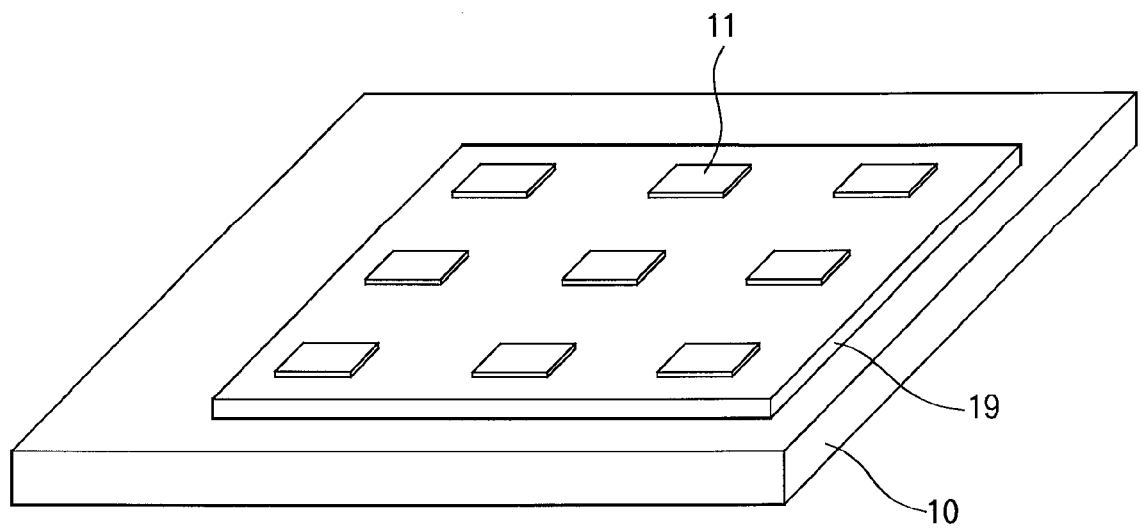
FIG. 14 is a schematic view showing a process for dividing inorganic material layers into a plurality of LED thin-film layered structures according to the fourth embodiment of the present invention.

FIG. 12 shows a process for peeling the thin-film layered structure (i.e., the LEDs 11) according to the fourth embodiment of the present invention. FIG. 13 shows a process for integrating the LED thin-film layered structure to the protection film 19 according to the fourth embodiment of the present invention. FIG. 14 shows a process for dividing the thin-film layered structure in the LEDs 11 according to the fourth embodiment of the present invention.

In FIGS. 12 though 14, a thin-film layered structure 23 (that becomes the LEDs 11) is in the form of an elongated band or a strip. The thin-film layered structure 23 is bonded to the protection film 19, and then divided into a plurality of LEDs 11 as described later. The thin-film layered structure 23 emits near-ultraviolet rays or ultraviolet rays, and is formed of a thin-film layered structure having heterostructure or double-heterostructure composed of a plurality of layers such as gallium nitride or indium gallium nitride, aluminum gallium nitride or aluminum nitride and the like.

The numeral 17 indicates a sacrificial layer formed between the base material 16 and the thin-film layered structure 23 as was described in the first embodiment. The sacrificial layer 17 is composed of material such as, for example, aluminum arsenide that can easily be etched by an etching solution described later.

As was described in the first embodiment, the base material 16 is composed of, for example, gallium arsenide, gallium nitride or sapphire. The thin-film layered structure 23 of inorganic material layers (that becomes the LEDs 11) is epitaxially grown on the base material 16 using a vapor-phase growth method such as an MOCVD method.

Next, a process for peeling the LED 11 (i.e., an epitaxially grown thin-film layered structure) from the base material 16 will be described.

If each LED 11 is designed to have, for example, a square shape having each side of 2 mm in length, the thin-film layered structure 23 is formed into a strip shape having a width greater than or equal to 2 mm and a length greater than or equal to the length of a column of the LED array (i.e., a column including three LEDs 11). In this case, the thin-film layered structure 23 is formed in the strip shape on the base material 16 using an etching liquid such as a solution containing phosphoric acid, hydrogen peroxide and water ($H_3PO_4:H_2O_2:H_2O$), by means of a photolithographic etching technique broadly used in a semiconductor manufacturing process.

Next, the base material 16 on which the thin-film layered structure 23 is formed is immersed in an etching solution such as hydrogen fluoride solution or hydrochloric solution or the like. With this, the sacrificial surface 17 is etched, and the thin-film layered structure 23 is peeled off from the base material 16.

Then, the thin-film layered structure 23 (having been peeled off from the base material 16) is pressed against the surface of the protection film 19, so that the protection film 19 and the LED 11 are fixed to and integrated with each other by means of intermolecular force such as hydrogen bonding. The protection film 19 is composed of an organic insulation film (such as polyimide film or the like) or an inorganic insulation film (such as silicon oxide firm or the like), and preferably has a flat surface whose surface accuracy is less than or equal to several tens of nanometers having no concaves or convexes, as was described in the third embodiment. Since the protection film 19 has such a flat surface having no concave or convex, the bonding between the LEDs 11 and the protection film 19 by means of intermolecular force (such as hydrogen bonding) can be facilitated.

By repeating the above described processes, the LED thin-film layered structures 23 of a plurality of columns (for example, three columns) are fixed to and integrated with the protection film 19.

Next, each thin-film layered structure 23 fixed to the protection film 19 is divided into a plurality of LEDs 11 using a photolithographic etching method by means of an etching solution containing phosphoric acid and hydrogen peroxide and water ($H_3PO_4:H_2O_2:H_2O$). In this embodiment, each thin-film layered structure 23 is divided into three LEDs 11. With this, as shown in FIG. 14, the LED array including the LEDs 11 arranged at equal intervals in a square grid and in a matrix of 3 rows and 3 columns on the protection film 19 can be obtained.

Subsequently, the anode electrode 14 and the cathode electrode 15 of the respective LEDs 11, and the anode wiring 12 (connected to the anode electrode 14) and the cathode wiring 13 (connected to the cathode electrode 15) are formed using a deposition, a photolithographic etching method or a lift-off method. In this regard, the anode electrode 14 and the cathode electrode 15 are metal electrodes composed of gold, aluminum, or layered metal electrodes composed of gold or aluminum layered with nickel, titan or the like. The anode driver IC 31 is connected to an end of the anode wiring 12 connected to the anode electrode 14 of the LED 11 closest to the anode driver IC 31 of each column of the LEDs 11. The cathode driver IC 32 is connected to an end of the cathode wiring 13 connected to the cathode electrode 15 of the LED 11 farthest from the anode driver IC 31 of each column of the LEDs 11. Further, the anode electrodes 14 and the cathode electrodes 15 of the adjacent LEDs 11 of each column are connected to each other by the interconnection wirings 21. In other words, the LEDs 11 of each column are connected in series by the interconnection wirings 21, and the anode electrode 14 and the cathode electrode 15 of the endmost LEDs 11 of each column are respectively connected to the anode driver IC 31 and the cathode driver IC 32 via the anode wiring 12 and the cathode wiring 13.

Here, the description is made to the case where each strip-shaped thin-film layered structure 23 is divided into the square-shaped LEDs 11. However, the LEDs 11 can have any shape such as an elongated rectangle, a rhomboidal shape or the like.

Next, the operation of the above configured LED backlight device 100 of the fourth embodiment will be described.

First, when a lighting signal sent from a superior device (such as a not shown personal computer) is inputted to the anode driver IC 31, the amplifier circuit of the anode driver IC 31 applies a constant current to the anode electrode 14 of the LED 11 closest to the anode driver IC 31 of each column of the LEDs via the anode wiring 12. When the lighting signal is inputted to the cathode driver IC 32, the cathode driver IC 32 operates to allow the current to flow into the cathode driver IC 32 from the cathode electrode 15 of the LED 11 farthest from the anode driver IC 31 of each column of the LEDs 11 via the cathode wiring 13 connected to the cathode driver IC 32 by the switching circuit of a large capacity. Therefore, current flows through the LEDs 11 connected by the interconnection wirings 21 in series in each column, so that the respective LEDs 11 emit the light.

When the respective LEDs 11 emit near-ultraviolet rays or ultraviolet rays having the wavelength ranging from 300 to 450 nm according to the lighting signal, the phosphor 41 (covering the LEDs 11) is excited by the near-ultraviolet rays or ultraviolet rays, and the phosphor 41 emits the white light as shown by the arrows B in FIG. 10. Further, the near-ultraviolet rays or ultraviolet rays emitted by the LED 11 toward the surface of the substrate 10, and the near-ultraviolet rays or ultraviolet rays reflected by the phosphor 41 or reflected at a boundary surface (on which the phosphor 41 is formed) are reflected by the reflection film 18, and is incident on the phosphor 41. Therefore, the phosphor 41 is also exited by the near-ultraviolet rays or ultraviolet rays reflected by the reflection film 18, and emits white light.

In this case, since the LEDs 11 of each column are connected in series, it is not necessary to provide constant current elements in applying the current (whose amount is the same as the case where the constant current element is provided) to the respective LEDs 11. Further, the heat generated by the emission of light of the LEDs 11 is diffused through the surface of the substrate 10 opposite to the LEDs 11 via the thermally-conductive adhesive agent 50 and the heat releasing plate 60, and therefore the temperature of the LED element portion 110 does not substantially increase.

As described above, in the fourth embodiment, a plurality of the LEDs 11 are provided on the reflection film 18 formed on the surface of the substrate 10, and the phosphor 41 is provided to entirely cover the LEDs 11, so that it becomes possible to provide a thinner LED backlight device 100 providing a high light intensity. Further, a plurality of the LEDs 11 can be formed to have desired sizes and shapes, and can be disposed on desired positions, and therefore the sizes, shapes and positions of the LEDs 11 can be adjusted, so that the variation in brightness can be restricted.

Modifications

Next, modifications of the fourth embodiment will be described with reference to FIGS. 15A and 15B.

FIG. 15A shows a modification in which a plurality of LEDs 11 are provided in the structure of the first embodiment (FIG. 1). In the modification shown in FIG. 15A, a plurality of LEDs 11 are fixed to the surface of the substrate 10. The LEDs 11 face the phosphor 41 formed on the surface of the transparent substrate 40. The anode wiring 12, the cathode wiring 13 and the interconnection wirings 21 are provided to electrically connect the LEDs 11 to the anode driver IC 31 and electrically connect the LEDs 11 to the cathode driver IC 32 as shown in FIG. 11. Other configuration is the same as the first embodiment.

In this case, the LEDs 11 are formed by epitaxially growing the inorganic material layers to form the thin-film layered structure on the sacrificial layer 17 on the base material 16 (FIG. 5), peeling the thin-film layered structure from the base material 16, and fixing the thin-film layered structure to the surface of the substrate 10 (FIG. 6) as described in the first embodiment, and further dividing the thin-film layered structure into the LEDs 11 using etching as described in the fourth embodiment.

FIG. 15B shows a modification in which a plurality of LEDs 11 are provided in the structure of the second embodiment (FIG. 7). In the modification shown in FIG. 15B, a plurality of LEDs 11 are fixed to the surface of the substrate 10, and the phosphor 41 is formed to entirely cover the LEDs 11 on the substrate 10. The anode wiring 12, the cathode wiring 13 and the interconnection wirings 21 are provided to electrically connect the LEDs 11 to the anode driver IC 31 and electrically connect the LEDs 11 to the he cathode driver IC 32 as shown in FIG. 11. Other configuration is the same as the second embodiment.

In this case, the LEDs 11 are formed by the epitaxially growing the inorganic material layers to form the thin-film layered structure on the sacrificial layer 17 on the base material 16 (FIG. 5), peeling the thin-film layered structure from the base material 16, and fixing the thin-film layered structure to the surface of the substrate 10 (FIG. 6) as described in the first embodiment, and further dividing the thin-film layered structure into the LEDs 11 using etching as described in the fourth embodiment.

Figure 16:
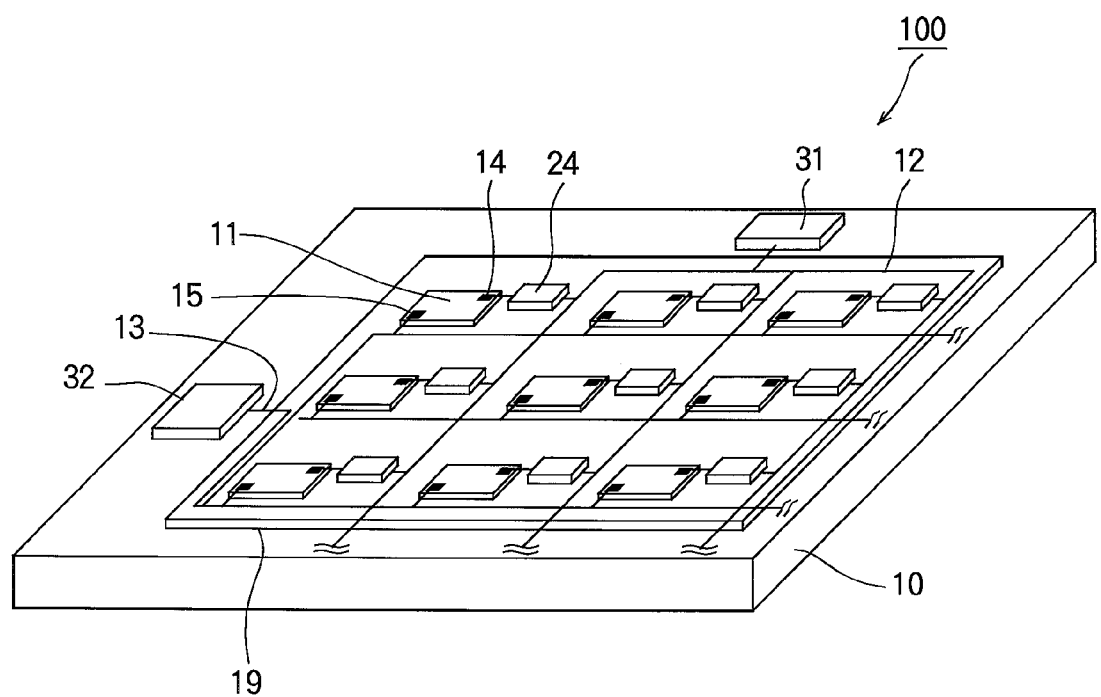
FIG. 16 shows another modification of the LED backlight device according to the embodiment of the present invention.

FIG. 16 shows another modification of the fourth embodiment regarding the arrangement for electrical connecting the LEDs 11 to the anode driver IC 31 and to the cathode driver IC 32. In the modification shown in FIG. 16, the anode wiring 12 (having an end connected to the anode driver IC 31) is branched into a plurality of branch lines. The respective branch lines extend along the respective columns and are connected to the anode electrodes 14 of the respective LEDs 11 of the respective columns. The anode electrodes 14 and the branch lines of the anode wiring 12 are connected via constant current elements 24 (i.e., electric resistances or the like). The anode driver IC 31 has a switching circuit of a large capacity capable of supplying ON-voltage to all of the constant current elements 24 according to the lighting signals, and supplying current to all of the LEDs 11. The cathode wiring 13 (having an end connected to the cathode driver IC 32) is branched into a plurality of branch lines. The respective branch lines extend along the respective rows and are connected to the cathode electrodes 15 of the respective LEDs 11 of the respective rows. The cathode driver IC 32 has a switching circuit of a large capacity capable of allowing the current to flow into the switching circuit from all of the LEDs 11.

The wiring structure shown in FIG. 16 is also applicable to the modifications shown in FIGS. 15A and 15B. When the wiring structure of FIG. 16 is applied to the modification of FIG. 15A, the LEDs 11, the anode wiring 12, the cathode wiring 13, the anode driver IC 31 and the cathode driver IC 32 are provided on the substrate 10 (i.e., the protection film 19 shown in FIG. 16 is not provided), and the LEDs 11 faces the phosphor 41 provided on the transparent substrate 40 (FIG. 15A). When the wiring structure of FIG. 16 is applied to the modification of FIG. 15B, the LEDs 11, the anode wiring 12, the cathode wiring 13, the anode driver IC 31 and the cathode driver IC 32 are provided on the substrate 10 (i.e., the protection film 19 shown in FIG. 16 is not provided), and the LEDs 11 are covered by the phosphor 41.

While the preferred embodiments of the present invention have been illustrated in detail, it should be apparent that modifications and improvements may be made to the invention without departing from the spirit and scope of the invention as described in the following claims.

What is claimed is:

1. An LED backlight device comprising:
  a first substrate;
  an LED thin-film layered structure fixed to a surface of said first substrate, said LED thin-film layered structure being formed of epitaxially grown inorganic material layers as a P-N junction device;
  an anode electrode and a cathode electrode formed on said LED thin-film layered structure;
  an anode driver IC and a cathode driver IC for driving said LED thin-film layered structure;
  a wiring structure that electrically connects said anode driver IC and said anode electrode of said LED thin-film layered structure, and electrically connects said cathode driver IC and said cathode electrode of said LED thin-film layered structure;
  a second substrate having an optical transparency and disposed to face said surface of said first substrate on which said LED thin-film layered structure is formed, and
  a phosphor formed on a surface of said second substrate facing said first substrate and disposed on a position corresponding to said LED thin-film layered structure.

2. The LED backlight device according to claim 1, wherein said wiring structure includes an anode wiring formed on said surface of said first substrate for connecting said anode driver IC and said anode electrode of said LED thin-film layered structure, and a cathode wiring formed on said surface of said first substrate for connecting said cathode driver IC and said cathode electrode of said LED thin-film layered structure.

3. The LED backlight device according to claim 1, wherein said LED thin-film layered structure is fixed to said surface of said first substrate by means of intermolecular force, and emits near-ultraviolet rays or ultraviolet rays having the wavelength ranging from 300 nm to 450 nm.

4. The LED backlight device according to claim 1, wherein said phosphor is formed by mixing a phosphor that emits red light having the wavelength ranging from 620 nm to 710 nm when exposed to light having the wavelength ranging from 300 nm to 450 nm, a phosphor that emits green light having the wavelength ranging from 500 nm to 580 nm when exposed to light having the wavelength ranging from 300 nm to 450 nm, a phosphor that emits blue light having the wavelength ranging from 450 nm to 500 nm when exposed to light having the wavelength ranging from 300 nm to 450 nm, and by coating a resultant mixed material.

5. The LED backlight device according to claim 1, wherein said LED thin-film layered structure is formed by epitaxially growing inorganic material layers as a p-n junction device on a sacrificial layer on a base material different from said first substrate, peeling said inorganic material layers from said base material by removing said sacrificial layer using etching, and fixing said inorganic material layers to said first substrate by means of intermolecular force.

6. The LED backlight device according to claim 1, further comprising a heat releasing plate provided on a surface of said first substrate opposite to said surface to which said LED thin-film layered structure is fixed.

7. The LED backlight device according to claim 1, wherein a plurality of said LED thin-film layered structures are fixed to said surface of said first substrate, said LED thin-film layered structure being disposed at intervals in rows and columns on said surface of said first substrate.

8. The LED backlight device according to claim 7, wherein said wiring structure comprises an anode wiring, a cathode wiring and an interconnection wiring respectively formed on said surface of said first substrate;
   wherein said anode wiring connects said anode driver IC and said anode electrode of an endmost LED thin-film layered structure of each column or row of said LED thin-film layered structures;
   wherein said cathode wiring connects said cathode driver IC and said cathode electrode of an endmost LED thin-film layered structure of each column or row of said LED thin-film layered structures, and
   wherein said interconnection wiring connects said LED thin-film layered structures of each column or row in series.

9. The LED backlight device according to claim 7, wherein said wiring structure comprises an anode wiring and a cathode wiring respectively formed on said surface of said first substrate;
   wherein said anode wiring connects said anode driver IC and said anode electrodes of said LED thin-film layered structures, and
   wherein said cathode wiring connects said cathode driver IC and said cathode electrodes of said LED thin-film layered structures.

10. The LED backlight device according to claim 7, wherein said LED thin-film layered structures are formed by epitaxially growing inorganic material layers as a p-n junction device on a sacrificial layer on a base material different from said first substrate, peeling said inorganic material layers from said base material by removing said sacrificial layer using etching, fixing said inorganic material layers to said first substrate by means of intermolecular force, and dividing said inorganic material layers into said plurality of LED thin-film layered structures using etching.

11. An LCD device comprising said LED backlight device according to claim 1 and an LCD panel provided to face the LED backlight device.

12. An LED backlight device comprising:
   a substrate having a planarized surface composed of an organic insulation film or an inorganic insulation film;
   an LED thin-film layered structure fixed to a surface of said substrate, said LED thin-film layered structure being formed of epitaxially grown inorganic material layers as a P-N junction device;
   an anode electrode and a cathode electrode formed on said LED thin-film layered structure;
   an anode driver IC and a cathode driver IC for driving said LED thin-film layered structure;
   a wiring structure that electrically connects said anode driver IC and said anode electrode of said LED thin-film layered structure, and electrically connects said cathode driver IC and said cathode electrode of said LED thin-film layered structure, and
   a phosphor formed to cover said LED thin-film layered structure.

13. The LED backlight device according to claim 12, wherein said wiring structure comprises an anode wiring and a cathode wiring respectively formed on said surface of said substrate;
   wherein said anode wiring connects said anode driver IC and said anode electrodes of said LED thin-film layered structures, and
   wherein said cathode wiring connects said cathode driver IC and said cathode electrodes of said LED thin-film layered structures.

14. The LED backlight device according to claim 12, wherein said LED thin-film layered structure is fixed to said surface of said substrate by means of intermolecular force, and emits near-ultraviolet rays or ultraviolet rays having the wavelength ranging from 300 nm to 450 nm.

15. The LED backlight device according to claim 12, wherein said phosphor is formed by mixing a phosphor that emits red light having the wavelength ranging from 620 nm to 710 nm when exposed to light having the wavelength ranging from 300 nm to 450 nm, a phosphor that emits green light having the wavelength ranging from 500 nm to 580 nm when exposed to light having the wavelength ranging from 300 nm to 450 nm, a phosphor that emits blue light having the wavelength ranging from 450 nm to 500 nm when exposed to light having the wavelength ranging from 300 nm to 450 nm, and by coating a resultant mixed material.

16. The LED backlight device according to claim 12, wherein said LED thin-film layered structure is formed by epitaxially growing inorganic material layers as a p-n junction device on a sacrificial layer on a base material different from said substrate, peeling said inorganic material layers from said base material by removing said sacrificial layer using etching, and fixing said inorganic material layers to said substrate by means of intermolecular force.

17. The LED backlight device according to claim 12, further comprising a heat releasing plate provided on a surface of said substrate opposite to said surface to which said LED thin-film layered structure is fixed.

18. The LED backlight device according to claim 12, wherein a plurality of said LED thin-film layered structures are fixed to said surface of said substrate, said LED thin-film layered structure being disposed at intervals in rows and columns on said surface of said substrate.

19. The LED backlight device according to claim 18, wherein said wiring structure comprises an anode wiring, a cathode wiring and an interconnection wiring respectively formed on said surface of said substrate;
   wherein said anode wiring connects said anode driver IC and said anode electrode of an endmost LED thin-film layered structure of each column or row of said LED thin-film layered structures;
wherein said cathode wiring connects said cathode driver IC and said cathode electrode of an endmost LED thin-film layered structure of each column or row of said LED thin-film layered structures, and
wherein said interconnection wiring connects said LED thin-film layered structures of each column or row in series.

20. The LED backlight device according to claim 18, wherein said wiring structure comprises an anode wiring and a cathode wiring respectively formed on said surface of said substrate;
wherein said anode wiring connects said anode driver IC and said anode electrodes of said LED thin-film layered structures, and
wherein said cathode wiring connects said cathode driver IC and said cathode electrodes of said LED thin-film layered structures.

21. The LED backlight device according to claim 19, wherein said LED thin-film layered structures are formed by epitaxially growing inorganic material layers as a p-n junction device on a sacrificial layer on a base material different from said substrate, peeling said inorganic material layers from said base material by removing said sacrificial layer using etching, fixing said inorganic material layers to said substrate by means of intermolecular force, and dividing said inorganic material layers into said plurality of LED thin-film layered structures using etching.

22. An LCD device comprising said LED backlight device according to claim 12 and an LCD panel provided to face the LED backlight device.

23. An LED backlight device comprising:
a substrate;
a reflection film formed on a surface of said substrate;
a protection film composed of an organic insulation film or an inorganic insulation film, said protection film being formed to cover said reflection film;
an LED thin-film layered structure fixed to a surface of said protection film, said LED thin-film layered structure being formed of epitaxially grown inorganic material layers as a P-N junction device;
an anode electrode and a cathode electrode formed on said LED thin-film layered structure;
an anode driver IC and a cathode driver IC for driving said LED thin-film layered structure;
a wiring structure that electrically connects said anode driver IC and said anode electrode of said LED thin-film layered structure, and electrically connects said cathode driver IC and said cathode electrode of said LED thin-film layered structure, and
a phosphor formed to cover said LED thin-film layered structure.

24. The LED backlight device according to claim 23, wherein said wiring structure comprises an anode wiring and a cathode wiring;
wherein said anode wiring connects said anode driver IC and said anode electrodes of said LED thin-film layered structures, and
wherein said cathode wiring connects said cathode driver IC and said cathode electrodes of said LED thin-film layered structures.

25. The LED backlight device according to claim 23, wherein said LED thin-film layered structure is fixed to said protection film on said substrate by means of intermolecular force, and emits near-ultraviolet rays or ultraviolet rays having the wavelength ranging from 300 nm to 450 nm.

26. The LED backlight device according to claim 23, wherein said phosphor is formed by mixing a phosphor that emits red light having the wavelength ranging from 620 nm to 710 nm when exposed to light having the wavelength ranging from 300 nm to 450 nm, a phosphor that emits green light having the wavelength ranging from 500 nm to 580 nm when exposed to light having the wavelength ranging from 300 nm to 450 nm, a phosphor that emits blue light having the wavelength ranging from 450 nm to 500 nm when exposed to light having the wavelength ranging from 300 nm to 450 nm, and by coating a resultant mixed material.

27. The LED backlight device according to claim 23, wherein said LED thin-film layered structure is formed by epitaxially growing inorganic material layers as a p-n junction device on a sacrificial layer on a base material different from said substrate, peeling said inorganic material layers from said base material by removing said sacrificial layer using etching, and fixing said inorganic material layers to said protection film on said substrate by means of intermolecular force.

28. The LED backlight device according to claim 23, further comprising a heat releasing plate provided on a surface of said substrate opposite to said surface to which said LED thin-film layered structure is fixed.

29. The LED backlight device according to claim 23, wherein a plurality of said LED thin-film layered structures are fixed to said protection film, said LED thin-film layered structure being disposed at intervals in rows and columns on said protection film.

30. The LED backlight device according to claim 29, wherein said LED thin-film layered structures are formed by epitaxially growing inorganic material layers as a p-n junction device on a sacrificial layer on a base material different from said substrate, peeling said inorganic material layers from said base material by removing said sacrificial layer using etching, fixing said inorganic material layers to said protection film by means of intermolecular force, and dividing said inorganic material layers into said plurality of LED thin-film layered structures using etching.

31. The LED backlight device according to claim 29, wherein said wiring structure comprises an anode wiring, a cathode wiring and an interconnection wiring;
wherein said anode wiring connects said anode driver IC and said anode electrode of an endmost LED thin-film layered structure of each column or row of said LED thin-film layered structures;
wherein said cathode wiring connects said cathode driver IC and said cathode electrode of an endmost LED thin-film layered structure of each column or row of said LED thin-film layered structures, and
wherein said interconnection wiring connects LED thin-film layered structures of each column or row in series.

32. The LED backlight device according to claim 29, wherein said wiring structure comprises an anode wiring and a cathode wiring;
wherein said anode wiring connects said anode driver IC and said anode electrodes of said LED thin-film layered structures, and
wherein said cathode wiring connects said cathode driver IC and said cathode electrodes of said LED thin-film layered structures.

33. An LCD device comprising said LED backlight device according to claim 23 and an LCD panel provided to face the LED backlight device.

* * * * *